(12) United States Patent
Chen (10) Patent No.: US 10,971,704 B2
(45) Date of Patent: Apr. 6, 2021

(54) DISPLAY PANEL AND DISPLAY DEVICE

(71) Applicants: HKC Corporation Limited, Guangdong (CN); Chongqing HKC Optoelectronics Technology Co., Ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/500,044

(22) PCT Filed: Aug. 10, 2017

(86) PCT No.: PCT/CN2017/096719
§ 371 (c)(1),
(2) Date: Oct. 1, 2019

(87) PCT Pub. No.: WO2018/184331
PCT Pub. Date: Oct. 11, 2018

(65) Prior Publication Data
US 2020/0185657 A1    Jun. 11, 2020

(30) Foreign Application Priority Data
Apr. 7, 2017   (CN) .......................... 201710223793.7

(51) Int. Cl.
*H01L 51/52*   (2006.01)
*H01L 27/12*   (2006.01)
*H01L 51/56*   (2006.01)

(52) U.S. Cl.
CPC ...... *H01L 51/5281* (2013.01); *H01L 27/1225* (2013.01); *H01L 27/1248* (2013.01); *H01L 51/5237* (2013.01); *H01L 51/56* (2013.01)

(58) Field of Classification Search
CPC ............. H01L 27/322; H01L 29/78633; H01L 29/7869; H01L 27/1225; H01L 29/66969;
(Continued)

(56) References Cited

U.S. PATENT DOCUMENTS

2013/0001579 A1*   1/2013   Jung ................... H01L 27/1248
                                                         257/72
2015/0001482 A1*   1/2015   Jung ................... H01L 27/3279
                                                         257/40
(Continued)

FOREIGN PATENT DOCUMENTS

CN   107170899 A   3/2013
CN   106125432 A   11/2016
(Continued)

*Primary Examiner* — Jonathan Han
(74) *Attorney, Agent, or Firm* — Muncy, Geissler, Olds & Lowe, P.C.

(57) ABSTRACT

A display panel includes a substrate, active switches, and an active layer. The active switches are disposed on the substrate, and the active layer is disposed on the active switches. A light-obstructing layer is disposed between the substrate and the active layer. The light-obstructing layer is provided with a light-permeable region, and orthogonal projection areas of the light-permeable region and the active layer on the substrate correspond to each other. The light-permeable region defines pixels of the display panel.

18 Claims, 4 Drawing Sheets

(58) Field of Classification Search
CPC ........... H01L 21/02565; H01L 29/4908; H01L 2227/323; H01L 29/78696
USPC ..... 257/40, 43, 59, 72, E29.296, 57; 438/30
See application file for complete search history.

(56) References Cited

U.S. PATENT DOCUMENTS

| | | | |
|---|---|---|---|
| 2016/0187695 A1* | 6/2016 | Cho | H01L 29/78633 |
| | | | 349/12 |
| 2018/0210249 A1* | 7/2018 | Ma | H01L 27/1225 |
| 2018/0350994 A1* | 12/2018 | Hosaka | H01L 29/78648 |

FOREIGN PATENT DOCUMENTS

| | | |
|---|---|---|
| JP | 2000078617 A | 3/2000 |
| JP | 2007295381 A | 11/2007 |

\* cited by examiner

DISPLAY PANEL AND DISPLAY DEVICE

BACKGROUND

Technical Field

This disclosure relates to a technical field of a display, and more particularly to a display panel and a display device.

Related Art

The active-matrix organic light-emitting diode (AMOLED) display screen has characteristics including high contrast, wide color gamut, high response and so on. Because the AMOLED with self-lighting characteristics needs not to use the backlight source, it is thinner and even flexible than the AMLCD. In the AMOLED display screen, specific TFTs are mainly controlled to adjust the switching and the brightness of the OLED device, and the frame is displayed after the ratio of the three primary colors is adjusted. The metal oxide semiconductor, which has not only the higher on-state current and the lower off-state current, but also the uniformity and better stability characteristics, is often used to control the TFTs.

After the anode process, a pixel definition layer (PDL) is used to define the pixels. Then, the process of the active layer is performed. The number of the conventional processes is high, and the processes are complicated. However, if the pixel definition layer is omitted, then the self-lighting panel has the non-uniform display or mixed color to affect the display effect.

SUMMARY

The technical problem to be solved by this disclosure is to provide a display panel with the enhanced display effect.

To achieve the above objective, the disclosure provides a display panel comprising a substrate, active switches, and an active layer. The active switches are disposed on the substrate, and the active layer is disposed on the active switches. A light-obstructing layer is disposed between the substrate and the active layer. The light-obstructing layer is provided with a light-permeable region, and orthogonal projection areas of the light-permeable region and the active layer on the substrate correspond to each other. The light-permeable region defines pixels of the display panel.

In one embodiment, a buffer layer and a passivation layer are disposed on and cover the substrate, an interlayer dielectric layer is disposed between the buffer layer and the passivation layer, and a planarization layer is disposed between the passivation layer and the active layer. The active layer comprises a light-emitting device, and the light-obstructing layer corrects light rays of the light-emitting device. The provision of the passivation layer can protect the active switches very well, and further extend the lifetime of the display panel. The light-obstructing layer blocks the non-uniform display edge portion of the active layer, and only the light rays that provide the uniform display and are consistent with the design are outputted, thereby effectively preventing the self lighting display panel from producing the non-uniform display or mixed color phenomenon, and ensuring the display effect of the self lighting display panel very well.

In one embodiment, the light-emitting device is a white organic light-emitting diode, a color resist layer is disposed on an upper surface or a lower surface of the passivation layer, and the color resist layer is disposed in correspondence with the white organic light-emitting diode. An orthogonal projection area of a white organic light-emitting diode on a substrate is larger than an orthogonal projection area of a color resist layer on the substrate, and the orthogonal projection of the white organic light-emitting diode on the substrate can completely cover the orthogonal projection of the color resist layer on the substrate, so that the light rays emitted by the white organic light-emitting diode pass through the color resist layer very well, and the display effect of the display panel can be thus improved very well. At the same time, the technical difficulty and manufacturing cost of the white organic light-emitting diode are low, and it is easy to achieve the commercialization of the display panel.

In one embodiment, the light-emitting device is a color organic light-emitting diode. The emission efficiency, the brightness and the contrast ratio of the color organic light-emitting diode are better than those of the white organic light-emitting diode, so that the thickness of the display panel can be effectively reduced, the display panel is more light and thin, and the better product competitiveness is obtained.

In one embodiment, each of the active switches comprises a semiconductor layer, a source and a drain. The semiconductor layer is disposed between the buffer layer and the interlayer dielectric layer. First ends of the source and the drain are disposed between the passivation layer and the interlayer dielectric layer, and second ends of the source and the drain pass through the interlayer dielectric layer and are respectively connected to two ends of the semiconductor layer.

In one embodiment, each of the active switches further comprises a gate, the gate is disposed in the interlayer dielectric layer, and a gate insulating layer is disposed between the gate and the semiconductor layer. Disposing the gate at the position between the source and the drain may also provide the very good light-obstructing function.

In one embodiment, the semiconductor layer is an indium gallium zinc oxide film layer. By providing the indium gallium zinc oxide film layer, it is possible to reduce the power consumption of the display panel very effectively and thus better save the electric energy in a very saving and environment protective manner. In addition, the mobility of the carriers thereof is 20 to 30 times that of the amorphous silicon, thereby greatly improving the charge/discharge rate of the active switch 2 to the pixel electrode, increasing the response speed of the pixel, achieving a faster refresh rate while faster responding and greatly improving the row scan rate of the pixel, so that the resolution can reach the full high definition (full HD) and even the ultra definition (UD) levels.

In one embodiment, the source passes through the buffer layer and is connected to the light-obstructing layer. This can very effectively obstruct the light rays of the active layer, effectively prevent the light rays of the active layer in the active switch from generating the light leakage, and effectively ease the non-uniform display or mixed color phenomenon, so that the display panel has a better display effect and the display effect of the display panel is thus further improved.

In one embodiment, the light-obstructing layer is also disposed between orthogonal projections of the source and the drain on the substrate, and the light-obstructing layer is disposed on the substrate and filled into a spacing gap between the orthogonal projections of the source and the drain on the substrate. The light rays of the active layer are irradiated onto the source and the drain, the source and the drain effectively obstruct the light rays, and the light rays of the active layer are irradiated onto positions between the source and the drain. First, a gate can obstruct the light rays very well, the light rays that have not been obstructed are irradiated to the light-obstructing layer, and the light-obstructing layer is disposed on the substrate and filled into a spacing gap between the orthogonal projections of the source and the drain on the substrate. This can very effectively obstruct the light rays of the active layer, effectively prevent the light rays of the active layer in the active switch from generating the light-leakage, and effectively ease the non-uniform display or mixed color phenomenon, so that the display panel has a better display effect, and the display effect of the display panel is thus further improved.

In another aspect of the disclosure, the disclosure further provides a display device comprising the above-mentioned display panel.

Using the light-obstructing layer to define the pixels of the self lighting display panel can remove one process of a pixel definition layer of the conventional self lighting display panel, can also prevent the process of the pixel definition layer from influencing the forgoing process, and can achieve the effective protection of the display panel, so that the display panel has a better display effect, and the display effect of the display panel is thus further improved. In addition, using the light-obstructing layer to define the pixels of the self lighting display panel blocks the non-uniform display edge portion of the active layer, and only the light rays that provide the uniform display and are consistent with the design are outputted, thereby effectively preventing the self lighting display panel from producing the non-uniform display or mixed color phenomenon, and ensuring the display effect of the self lighting display panel very well. When the processes of the pixel definition layer are reduced, and the negative influence of the temperature in the process of the pixel definition layer on the penetration rate of the planarization layer is also reduced. This can protect the planarization layer very well, and thus ensure the lifetime and the efficiency of the display panel. The structure process of the self lighting display panel is optimized, the processes of the pixel definition layer are reduced, the manufacturing cost can be saved very well, and the process adaptability of the planarization layer can be further improved.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount," "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one," "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

The embodiments of the invention will be apparent from the following detailed description.

Figure 1:
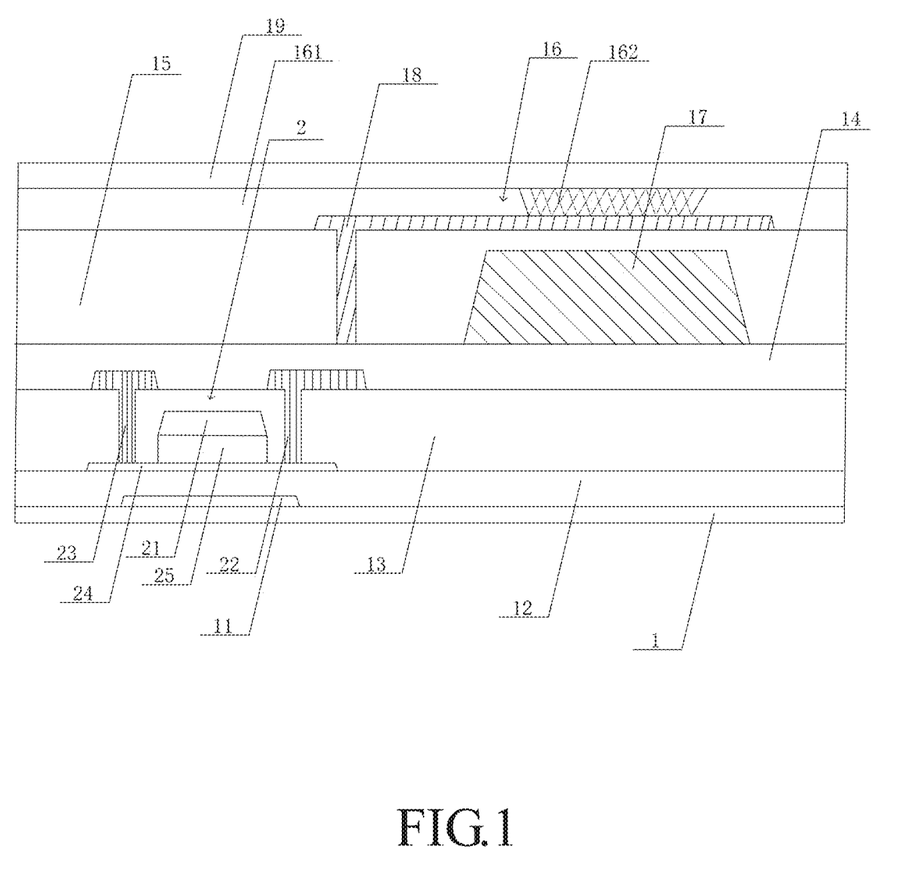
FIG. 1 is a schematically cross-sectional view showing a display panel according to an embodiment of this disclosure.
Figure 2:
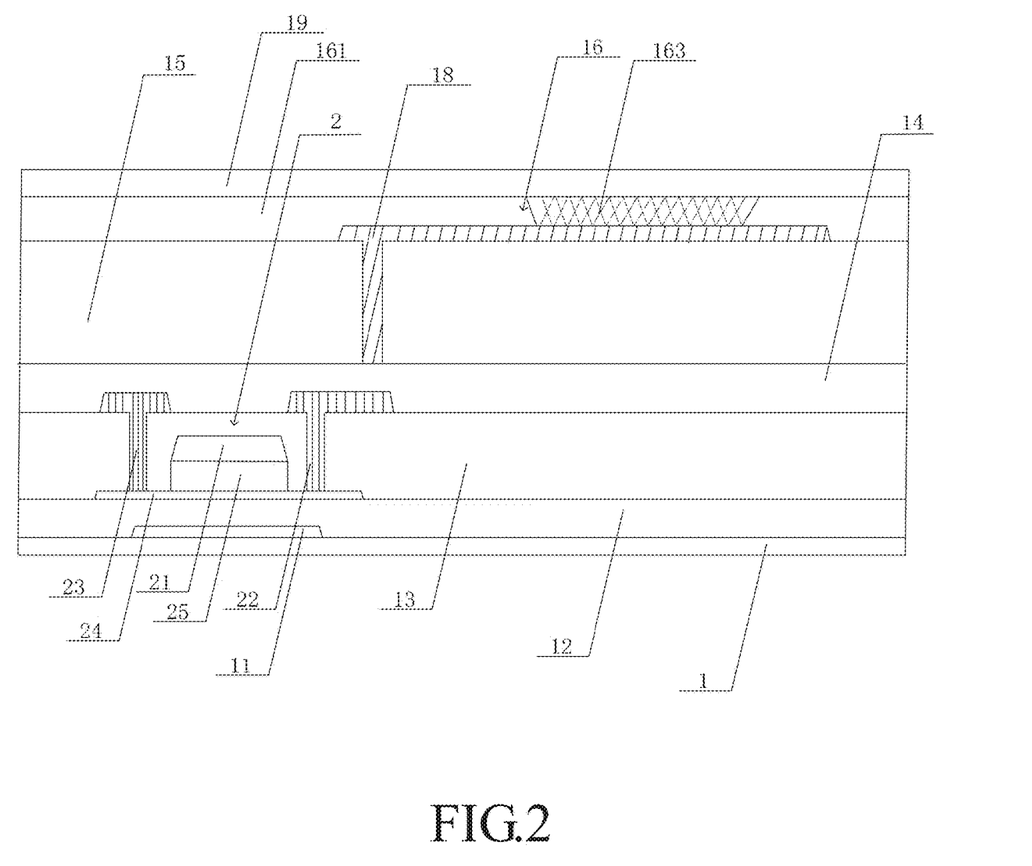
FIG. 2 is a schematically cross-sectional view showing a display panel according to an embodiment of this disclosure.

As shown in FIGS. 1 and 2, commonly used structures of an array of oxide semiconductor active switches 2 include the etch stop, the back trench etching, the co-planar self-aligned top gate, the double gate machine and other structures, wherein the problem of channel etching needs not to be considered in the co-planar self-aligned top gate, and the self-aligned structure can shorten the length of the trench and improve the resolution of the panel. In the self-lighting display panel structure, a process to forming a planarization layer 15 is often provided first. After the anode process, a pixel definition layer (PDL) 161 is used to define the pixels. Then, the process of the active layer is performed.

It is found from further study that the number of the conventional processes is high, and the processes are complicated. However, if the pixel definition layer 161 is omitted, then the self-lighting panel has the non-uniform display or mixed color to affect the display effect. Besides, the penetration of the planarization layer 15 is affected by the temperature more significantly in the subsequent processes, and the fewer subsequent processes of the planarization layer 15 are preferred. Thus, this disclosure provides a new technical solution, which can effectively decrease the subsequent processes, and improve the display effect of the display panel.

The structure of the display panel according to an embodiment of the disclosure will be described hereinafter with reference to the accompanying drawings.

Figure 3:
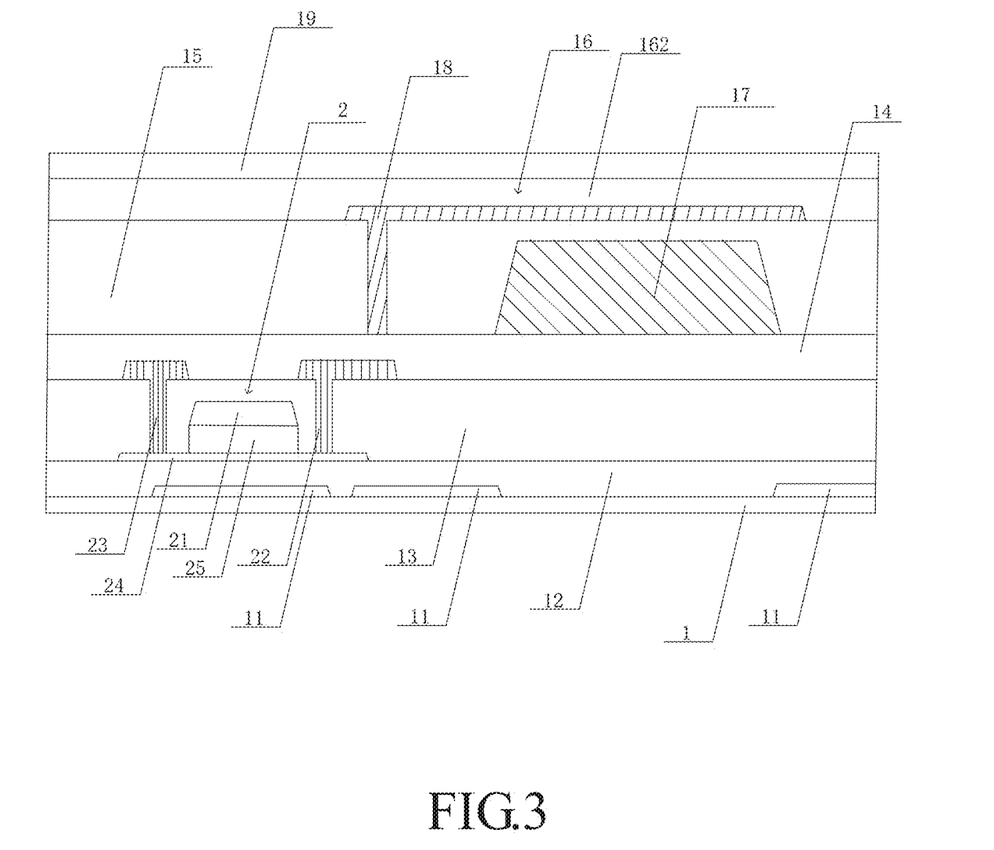
FIG. 3 is a schematically cross-sectional view showing a display panel according to another implementation aspect of an embodiment of this disclosure.

As shown in FIG. 3, the display panel of the embodiment comprises a substrate 1, active switches 2, and an active layer 16. A light-obstructing layer 11 is disposed between the substrate 1 and the active layer 16. The light-obstructing layer 11 is provided with a light-permeable region, and orthogonal projection areas of the light-permeable region and the active layer 16 on the substrate 1 correspond to each other. The light-permeable region defines pixels of the display panel.

Using the light-obstructing layer 11 to define the pixels of the self lighting display panel can remove one process of a pixel definition layer 161 of the conventional self lighting display panel, can also prevent the process of the pixel definition layer 161 from influencing the forgoing process, and can achieve the effective protection of the display panel, so that the display panel has a better display effect, and the display effect of the display panel is thus further improved. In addition, using the light-obstructing layer 11 to define the pixels of the self lighting display panel blocks the non-uniform display edge portion of the active layer 16, and only the light rays that provide the uniform display and are consistent with the design are outputted, thereby effectively preventing the self lighting display panel from producing the non-uniform display or mixed color phenomenon, and ensuring the display effect of the self lighting display panel very well. When the processes of the pixel definition layer 161 are reduced, and the negative influence of the temperature in the process of the pixel definition layer 161 on the penetration rate of the planarization layer 15 is also reduced. This can protect the planarization layer 15 very well, and thus ensure the lifetime and the efficiency of the display panel. The structure process of the self lighting display panel is optimized, the processes of the pixel definition layer 161 are reduced, the manufacturing cost can be saved very well, and the process adaptability of the planarization layer 15 can be further improved.

The buffer layer 12 and the passivation layer 14 are disposed on and cover the substrate 1. The interlayer dielectric layer 13 is disposed between the buffer layer 12 and the passivation layer 14. The active switches 2 can provide the light-obstructing function very well and effectively ease the non-uniform display or mixed color phenomenon, so that the display panel has the better display effect.

The provision of a passivation layer 14 can protect the active switches 2 very well, and further extend the lifetime of the display panel. The planarization layer 15 is disposed between the passivation layer 14 and an active layer 16. The active layer 16 includes a light-emitting device. A light-obstructing layer 11 corrects light rays of the light-emitting device. The passivation layer 14 blocks the non-uniform display edge portion of the active layer 16, and only the light rays that provide the uniform display and are consistent with the design are outputted, thereby effectively preventing the self lighting display panel from producing the non-uniform display or mixed color phenomenon, and ensuring the display effect of the self lighting display panel very well. A lower surface of the active layer 16 is provided with a transparent anode 18. That is, the transparent anode 18 is disposed between the active layer 16 and the planarization layer 15. The material of the transparent anode may be selected from various materials, such as a transparent electroconductive material, such as a graphene composite material, indium tin oxide (ITO), or the like. An upper surface of the active layer 16 is provided with a metal cathode 19.

The light-emitting device is a white organic light-emitting diode 162. A color resist layer 17 is disposed on an upper surface of the passivation layer 14, and the color resist layer 17 is disposed in correspondence with the white organic light-emitting diode 162. An orthogonal projection area of a white organic light-emitting diode 162 on a substrate 1 is larger than an orthogonal projection area of a color resist layer 17 on the substrate 1, and the orthogonal projection of the white organic light-emitting diode 162 on the substrate 1 can completely cover the orthogonal projection of the color resist layer 17 on the substrate 1, so that the light rays emitted by the white organic light-emitting diode 162 pass through the color resist layer 17 very well, and the display effect of the display panel can be thus improved very well. At the same time, the technical difficulty and manufacturing cost of the white organic light-emitting diode 162 are low, and it is easy to achieve the commercialization of the display panel.

If the color resist layer 17 is disposed on a lower surface of the passivation layer 14 (that is, the color resist layer 17 is disposed between the passivation layer 14 and an interlayer dielectric layer 13), then coving the passivation layer 14 on the active switches 2 and the color resist layer 17 can effectively prevent the color filter in the subsequent process from causing the problem of the gas overflow of the color resist layer 17, so that the passivation layer 14 can protect the color resist layer 17 very well, and thus ensure the lifetime and the efficiency of the display panel. In addition, the effective protection of the display panel can be achieved by only changing the order of the process masks without increasing the process steps and changing the styles of the current masks, so that the display panel has a better display effect, and the display effect of the display panel can be thus further improved.

Each of the active switches 2 includes a semiconductor layer 24, the source 22 and the drain 23. The semiconductor layer 24 is disposed between the buffer layer 12 and the interlayer dielectric layer 13. First ends of the source 22 and the drain 23 are disposed between the passivation layer 14 and the interlayer dielectric layer 13, and second ends of the source 22 and the drain 23 pass through the interlayer dielectric layer 13 and are respectively connected to two ends of the semiconductor layer 24. The active switch 2 further includes the gate 21, the gate 21 is disposed in the interlayer dielectric layer 13, and a gate insulating layer 25 is disposed between the gate 21 and the semiconductor layer 24. Disposing the gate 21 at the position between the source 22 and the drain 23 may also provide the very good light-obstructing function.

The semiconductor layer 24 is an oxide film layer. The oxide film layer may use the materials including ZnO, Zn—Sn—O, In—Zn—O, MgZnO, In—Ga—O, $In_2O_3$ and the like. These materials can be prepared by way of magnetron sputtering, pulsed laser deposition, electron beam evaporation and other methods. Compared with the conventional amorphous silicon which has problems of the low carrier mobility and the strong photosensitivity, the oxide film layer has a higher carrier mobility property, has obvious advantages in the uniformity and stability and the like, and shows a huge application prospects. The active switch 2 using the oxide film layer has a higher switching current ratio, a higher field-effect mobility and a high response speed, and can achieve a higher drive current and enable the preparing of a large area display panel. In addition, the active switch 2 using the oxide film layer can be prepared at the room temperature, and the flexible underlay can be used at the low preparation temperature, thereby causing the appearance of the flexible display. Compared with the existing display technology, the flexible display technology is more portable, lighter, more resistant to wrestling and the like, and the use of oxide semiconductors is most suitable for the semiconductor materials of the flexible displays.

Optionally, the oxide film layer used is the indium gallium zinc oxide film layer. By providing the indium gallium zinc oxide film layer, it is possible to reduce the power consumption of the display panel very effectively and thus better save the electric energy in a very saving and environment protective manner. In addition, the mobility of the carriers thereof is 20 to 30 times that of the amorphous silicon, thereby greatly improving the charge/discharge rate of the active switch 2 to the pixel electrode, increasing the response speed of the pixel, achieving a faster refresh rate while faster responding and greatly improving the row scan rate of the pixel, so that the resolution can reach the full high definition (full HD) and even the ultra definition (UD) levels. In addition, because the number of transistors is reduced and the transmission of each pixel is improved, the display panel has a higher level of energy efficiency and is more efficient. Meanwhile, using the existing amorphous silicon production line for production only needs a little change, so its cost is more competitive than the low-temperature polysilicon.

A source 22 passes through a buffer layer 12 and is connected to the light-obstructing layer 11. This can very effectively obstruct the light rays of the active layer 16, effectively prevent the light rays of the active layer 16 in the active switch 2 from generating the light leakage, and effectively ease the non-uniform display or mixed color phenomenon, so that the display panel has a better display effect and the display effect of the display panel is thus further improved.

The light-obstructing layer 11 is also disposed between orthogonal projections of the source 22 and a drain 23 on the substrate 1, and the light-obstructing layer 11 is disposed on the substrate 1 and filled into a spacing gap between the orthogonal projections of the source 22 and the drain 23 on the substrate 1. The light rays of the active layer 16 are irradiated onto the source 22 and the drain 23, the source 22 and the drain 23 effectively obstruct the light rays, and the light rays of the active layer 16 are irradiated onto positions between the source 22 and the drain 23. First, a gate 21 can obstruct the light rays very well, the light rays that have not been obstructed are irradiated to the light-obstructing layer 11, and the light-obstructing layer 11 is disposed on the substrate 1 and filled into a spacing gap between the orthogonal projections of the source 22 and the drain 23 on the substrate 1. This can very effectively obstruct the light rays of the active layer 16, effectively prevent the light rays of the active layer 16 in the active switch 2 from generating the light-leakage, and effectively ease the non-uniform display or mixed color phenomenon, so that the display panel has a better display effect, and the display effect of the display panel is thus further improved. Of course, the light-obstructing layer 11 may not be provided on the orthogonal projection of the gate 21 on the substrate 1, and this can very effectively save the consumable material, can reduce the manufacturing costs of the display panel very well, and can effectively reduce the weight of the display panel, so that the display panel can be moved more conveniently.

Figure 4:
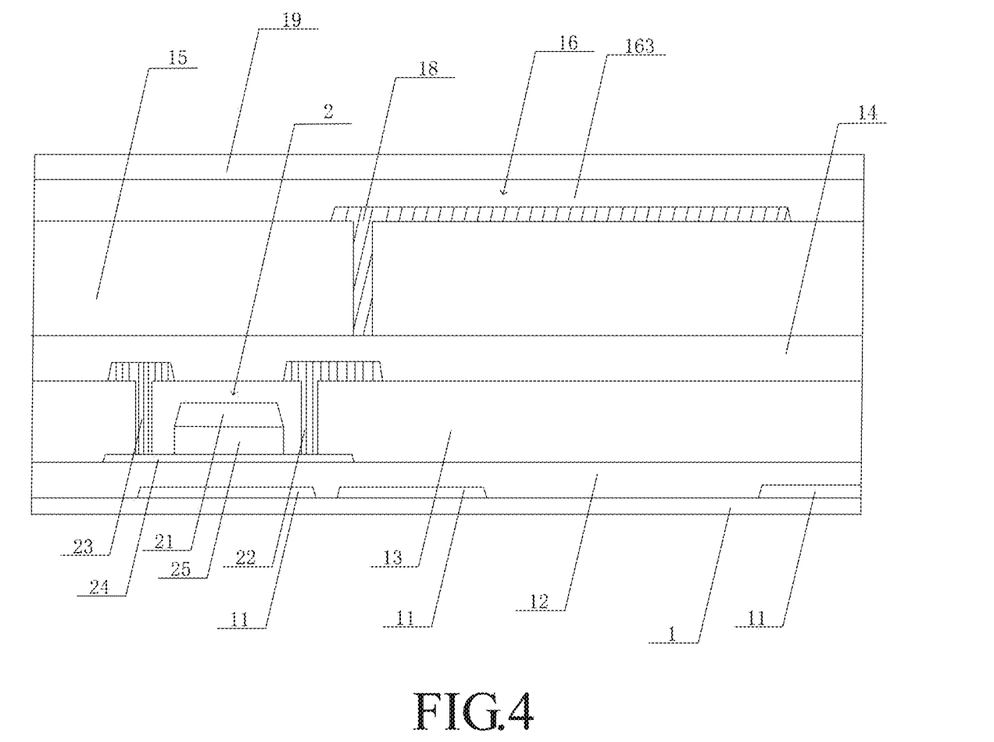
FIG. 4 is a schematically cross-sectional view showing a display panel according to another implementation aspect of an embodiment of this disclosure.

An implementation method shown in FIG. 4 provides a display panel including the substrate 1, the active switches 2 and the active layer 16. The light-obstructing layer 11 is disposed between the substrate 1 and the active layer 16, the light-obstructing layer 11 is provided with the light-permeable region, the orthogonal projection areas of the light-permeable region and the active layer 16 on the substrate correspond to each other, and the light-permeable region defines pixels of the display panel.

Using the light-obstructing layer 11 to define the pixels of the self lighting display panel can remove one process of a pixel definition layer 161 of the conventional self lighting display panel, can also prevent the process of the pixel definition layer 161 from influencing the forgoing process, and can achieve the effective protection of the display panel, so that the display panel has a better display effect, and the display effect of the display panel is thus further improved. In addition, using the light-obstructing layer 11 to define the pixels of the self lighting display panel blocks the non-uniform display edge portion of the active layer 16, and only the light rays that provide the uniform display and are consistent with the design are outputted, thereby effectively preventing the self lighting display panel from producing the non-uniform display or mixed color phenomenon, and ensuring the display effect of the self lighting display panel very well. When the processes of the pixel definition layer 161 are reduced, and the negative influence of the temperature in the process of the pixel definition layer 161 on the penetration rate of the planarization layer 15 is also reduced. This can protect the planarization layer 15 very well, and thus ensure the lifetime and the efficiency of the display panel. The structure process of the self lighting display panel is optimized, the processes of the pixel definition layer 161 are reduced, the manufacturing cost can be saved very well, and the process adaptability of the planarization layer 15 can be further improved.

The buffer layer 12 and the passivation layer 14 are disposed on and cover the substrate 1. The interlayer dielectric layer 13 is disposed between the buffer layer 12 and the passivation layer 14. The active switch 2 can provide the light-obstructing function very well and effectively ease the non-uniform display or mixed color phenomenon, so that the display panel has the better display effect.

The provision of a passivation layer 14 can protect the active switches 2 very well, and further extend the lifetime of the display panel. The planarization layer 15 is disposed between the passivation layer 14 and an active layer 16. The active layer 16 includes a light-emitting device. A light-obstructing layer 11 corrects light rays of the light-emitting device. The passivation layer 14 blocks the non-uniform display edge portion of the active layer 16, and only the light rays that provide the uniform display and are consistent with the design are outputted, thereby effectively preventing the self lighting display panel from producing the non-uniform display or mixed color phenomenon, and ensuring the display effect of the self lighting display panel very well. A lower surface of the active layer 16 is provided with a transparent anode 18. That is, the transparent anode 18 is disposed between the active layer 16 and the planarization layer 15. An upper surface of the active layer 16 is provided with a metal cathode 19.

The light-emitting device is a color organic light-emitting diode 163, and the emission efficiency, the brightness and the contrast ratio of the color organic light-emitting diode 163 are better than those of the white organic light-emitting diode 162, so that the thickness of the display panel can be effectively reduced, the display panel is more light and thin, and the better product competitiveness is obtained.

Each of the active switches 2 includes a semiconductor layer 24, the source 22 and the drain 23. The semiconductor layer 24 is disposed between the buffer layer 12 and the interlayer dielectric layer 13. First ends of the source 22 and the drain 23 are disposed between the passivation layer 14 and the interlayer dielectric layer 13, and second ends of the source 22 and the drain 23 pass through the interlayer dielectric layer 13 and are respectively connected to two ends of the semiconductor layer 24. The active switch 2 further includes the gate 21, the gate 21 is disposed in the interlayer dielectric layer 13, and a gate insulating layer 25 is disposed between the gate 21 and the semiconductor layer 24. Disposing the gate 21 at the position between the source 22 and the drain 23 may also provide the very good light-obstructing function.

The semiconductor layer 24 is an oxide film layer. The oxide film layer may use the materials including ZnO, Zn—Sn—O, In—Zn—O, MgZnO, In—Ga—O, $In_2O_3$ and the like. These materials can be prepared by way of magnetron sputtering, pulsed laser deposition, electron beam evaporation and other methods. Compared with the conventional amorphous silicon which has problems of the low carrier mobility and the strong photosensitivity, the oxide film layer has a higher carrier mobility property, has obvious advantages in the uniformity and stability and the like, and shows a huge application prospects. The active switch 2 using the oxide film layer has a higher switching current ratio, a higher field-effect mobility and a high response speed, and can achieve a higher drive current and enable the preparing of a large area display panel. In addition, the active switch 2 using the oxide film layer can be prepared at the room temperature, and the flexible underlay can be used at the low preparation temperature, thereby causing the appearance of the flexible display. Compared with the existing display technology, the flexible display technology is more portable, lighter, more resistant to wrestling and the like, and the use of oxide semiconductors is most suitable for the semiconductor materials of the flexible displays.

Optionally, the oxide film layer used is the indium gallium zinc oxide film layer. By providing the indium gallium zinc oxide film layer, it is possible to reduce the power consumption of the display panel very effectively and thus better save the electric energy in a very saving and environment protective manner. In addition, the mobility of the carriers thereof is 20 to 30 times that of the amorphous silicon, thereby greatly improving the charge/discharge rate of the active switch 2 to the pixel electrode, increasing the response speed of the pixel, achieving a faster refresh rate while faster responding and greatly improving the row scan rate of the pixel, so that the resolution can reach the full high definition (full HD) and even the ultra definition (UD) levels. In addition, because the number of transistors is reduced and the transmission of each pixel is improved, the display panel has a higher level of energy efficiency and is more efficient. Meanwhile, using the existing amorphous silicon production line for production only needs a little change, so its cost is more competitive than the low-temperature polysilicon.

A source 22 passes through a buffer layer 12 and is connected to the light-obstructing layer 11. This can very effectively obstruct the light rays of the active layer 16, effectively prevent the light rays of the active layer 16 in the active switch 2 from generating the light leakage, and effectively ease the non-uniform display or mixed color phenomenon, so that the display panel has a better display effect and the display effect of the display panel is thus further improved.

The light-obstructing layer 11 is also disposed between orthogonal projections of the source 22 and a drain 23 on the substrate 1, and the light-obstructing layer 11 is disposed on the substrate 1 and filled into a spacing gap between the orthogonal projections of the source 22 and the drain 23 on the substrate 1. The light rays of the active layer 16 are irradiated onto the source 22 and the drain 23, the source 22 and the drain 23 effectively obstruct the light rays, and the light rays of the active layer 16 are irradiated onto positions between the source 22 and the drain 23. First, a gate 21 can obstruct the light rays very well, the light rays that have not been obstructed are irradiated to the light-obstructing layer 11, and the light-obstructing layer 11 is disposed on the substrate 1 and filled into a spacing gap between the orthogonal projections of the source 22 and the drain 23 on the substrate 1. This can very effectively obstruct the light rays of the active layer 16, effectively prevent the light rays of the active layer 16 in the active switch 2 from generating the light-leakage, and effectively ease the non-uniform display or mixed color phenomenon, so that the display panel has a better display effect, and the display effect of the display panel is thus further improved. Of course, the light-obstructing layer 11 may not be provided on the orthogonal projection of the gate 21 on the substrate 1, and this can very effectively save the consumable material, can reduce the manufacturing costs of the display panel very well, and can effectively reduce the weight of the display panel, so that the display panel can be moved or transported more conveniently.

Figure 5:
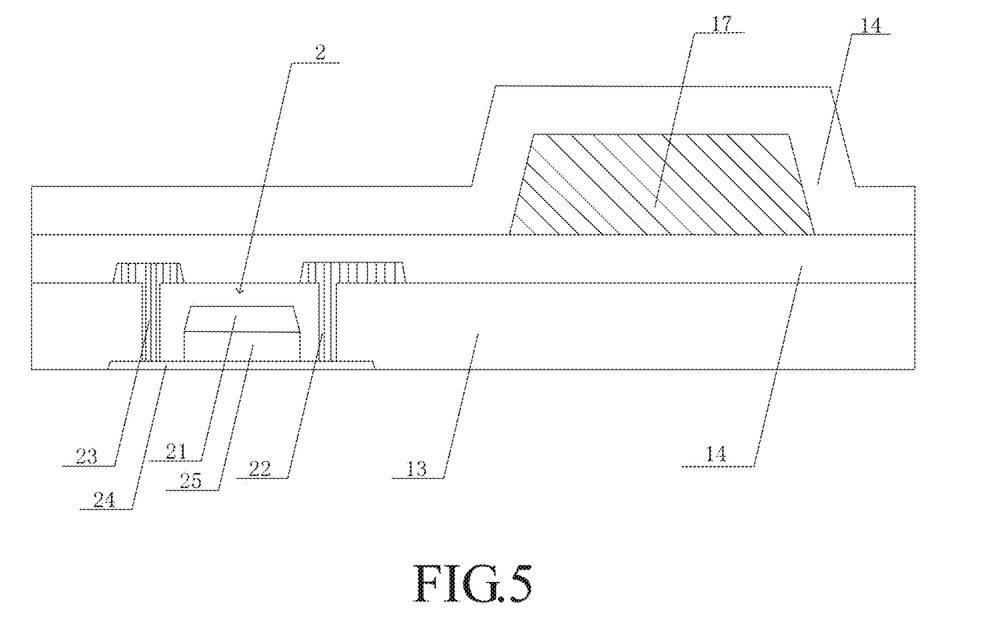
FIG. 5 is a schematically cross-sectional view showing a display panel according to another implementation aspect of an embodiment of this disclosure.

As shown in FIG. 5, the passivation layer 14 is improved in this embodiment, wherein the passivation layer 14 is provided with two layers, the passivation layer 14 is disposed between the planarization layer 15 and the interlayer dielectric layer 13, the color resist layer 17 is disposed between the two layers of the passivation layer 14, the source 22 and the drain 23 are made of a metal material, and the lateral sides of the source 22 and the drain 23 have a metal burr phenomenon from the micro-structure. By disposing two layers of the passivation layer 14, it is possible to better cover the metal burr on the metal layer and prevent the metal burr from exposing from the protection layer very effectively, so that the protection layer can better protect the metal layer. This can effectively prevent the subsequent processes from influencing the source 22 and the drain 23, and improve the yield of the display panel very well. Disposing the color resist layer 17 between the two layers of the passivation layer 14 can protect the color resist layer 17 very well, effectively prevent the subsequent process from causing the organic material of the color resist layer 17 to release the gas with some harmful impurities, thus achieve the effective protection for the display panel, and increase its efficiency and lifetime.

According to another aspect of this disclosure, this disclosure further discloses a display device, and the display device includes the above-mentioned display panel. The specific structure and connection relationship with respect to the display panel can be found according to the first to third embodiments and FIGS. 1 to 5, and detailed descriptions thereof will be omitted.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
a substrate;
active switches disposed on the substrate; and
an active layer disposed on the active switches;
wherein a light-obstructing layer is disposed between the substrate and the active layer, the light-obstructing layer is provided with a light-permeable region, orthogonal projection areas of the light-permeable region and the active layer on the substrate correspond to each other, and the light-permeable region defines pixels of the display panel; a buffer layer and a passivation layer are disposed on and cover the substrate, an interlayer dielectric layer is disposed between the buffer layer and the passivation layer, a planarization layer is disposed between the passivation layer and the active layer, the active layer comprises a light-emitting device, and the light-obstructing layer corrects light rays of the light-emitting device; the light-emitting device is a color organic light-emitting diode; the light-obstructing layer is also disposed between orthogonal projections of a source and a drain of the active switch on the substrate, and the light-obstructing layer is disposed on the substrate and filled into a spacing gap between the orthogonal projections of the source and the drain on the substrate,
wherein a transparent anode is disposed between the active layer and the planarization layer and an upper surface of the active layer is provided with a metal cathode.

2. A display panel, comprising:
a substrate;
active switches disposed on the substrate; and
an active layer disposed on the active switches;
wherein a light-obstructing layer is disposed between the substrate and the active layer, the light-obstructing layer is provided with a light-permeable region, orthogonal projection areas of the light-permeable region and the active layer on the substrate correspond to each other, and the light-permeable region defines pixels of the display panel; a buffer layer and a passivation layer are disposed on and cover the substrate, an interlayer dielectric layer is disposed between the buffer layer and the passivation layer, a planarization layer is disposed between the passivation layer and the active layer, the active layer comprises a light-emitting device, and the light-obstructing layer corrects light rays of the light-emitting device,
wherein a transparent anode is disposed between the active layer and the planarization layer and an upper surface of the active layer is provided with a metal cathode.

3. The display panel according to claim 2, wherein the light-emitting device is a white organic light-emitting diode, a color resist layer is disposed on an upper surface or a lower surface of the passivation layer, and the color resist layer is disposed in correspondence with the white organic light-emitting diode.

4. The display panel according to claim 2, wherein the light-emitting device is a color organic light-emitting diode.

5. The display panel according to claim 2, wherein each of the active switches comprises a semiconductor layer, a source and a drain, the semiconductor layer is disposed between the buffer layer and the interlayer dielectric layer, first ends of the source and the drain are disposed between the passivation layer and the interlayer dielectric layer, and second ends of the source and the drain pass through the interlayer dielectric layer and are respectively connected to two ends of the semiconductor layer.

6. The display panel according to claim 5, wherein the active switch further comprises a gate, the gate is disposed in the interlayer dielectric layer, and a gate insulating layer is disposed between the gate and the semiconductor layer.

7. The display panel according to claim 5, wherein the semiconductor layer is an indium gallium zinc oxide film layer.

8. The display panel according to claim 5, wherein the source passes through the buffer layer and is connected to the light-obstructing layer.

9. The display panel according to claim 5, wherein the light-obstructing layer is also disposed between orthogonal projections of the source and the drain on the substrate, and the light-obstructing layer is disposed on the substrate and filled into a spacing gap between the orthogonal projections of the source and the drain on the substrate.

10. A display device comprising a display panel, the display panel comprising:
a substrate;
active switches disposed on the substrate; and
an active layer disposed on the active switches;
wherein a light-obstructing layer is disposed between the substrate and the active layer, the light-obstructing layer is provided with a light-permeable region, orthogonal projection areas of the light-permeable region and the active layer on the substrate correspond to each other, and the light-permeable region defines pixels of the display panel, a buffer layer and a passivation layer are disposed on and cover the substrate, an interlayer dielectric layer is disposed between the buffer layer and the passivation layer, a planarization layer is disposed between the passivation layer and the active layer, the active layer comprises a light-emitting device, and the light-obstructing layer corrects light rays of the light-emitting device,
wherein a transparent anode is disposed between the active layer and the planarization layer and an upper surface of the active layer is provided with a metal cathode.

11. The display device according to claim 10, wherein the light-emitting device is a white organic light-emitting diode, a color resist layer is disposed on an upper surface or a lower surface of the passivation layer, and the color resist layer is disposed in correspondence with the white organic light-emitting diode.

12. The display device according to claim 10, wherein the light-emitting device is a color organic light-emitting diode.

13. The display device according to claim 10, each of the active switches comprises a semiconductor layer, a source and a drain, the semiconductor layer is disposed between the buffer layer and the interlayer dielectric layer, first ends of the source and the drain are disposed between the passivation layer and the interlayer dielectric layer, and second ends of the source and the drain pass through the interlayer dielectric layer and are respectively connected to two ends of the semiconductor layer.

14. The display device according to claim 13, wherein the active switch further comprises a gate, the gate is disposed in the interlayer dielectric layer, and a gate insulating layer is disposed between the gate and the semiconductor layer.

15. The display device according to claim 13, wherein the semiconductor layer is an oxide film layer.

16. The display device according to claim 15, wherein the oxide film layer is an indium gallium zinc oxide film layer.

17. The display device according to claim 13, wherein the source passes through the buffer layer and is connected to the light-obstructing layer.

18. The display device according to claim 13, wherein the light-obstructing layer is also disposed between orthogonal projections of the source and the drain on the substrate, and the light-obstructing layer is disposed on the substrate and filled into a spacing gap between the orthogonal projections of the source and the drain on the substrate.

* * * * *